(12) United States Patent
Krishnamurthy et al.

(10) Patent No.: US 6,597,623 B2
(45) Date of Patent: Jul. 22, 2003

(54) LOW POWER ARCHITECTURE FOR REGISTER FILES

(75) Inventors: Ram Krishnamurthy, Portland, OR (US); Ganesh Balamurugan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 09/896,349

(22) Filed: Jun. 28, 2001

(65) Prior Publication Data

US 2003/0002379 A1 Jan. 2, 2003

(51) Int. Cl.[7] .................................................. G11C 8/00
(52) U.S. Cl. ................... 365/230.06; 365/194; 365/227
(58) Field of Search ........................... 365/230.06, 194, 365/227

(56) References Cited

U.S. PATENT DOCUMENTS 5,233,565 A * 8/1993 Wang ...................... 365/233.5
5,357,479 A * 10/1994 Matsui ................... 365/230.06
6,044,035 A * 3/2000 Kohno ................... 365/230.06
6,195,308 B1 * 2/2001 Durham et al. ........ 365/230.06

* cited by examiner

Primary Examiner—Richard Elms
Assistant Examiner—Tuan T. Nguyen
(74) Attorney, Agent, or Firm—Blakely, Sokoloff, Taylor & Zafman LLP

(57) ABSTRACT

A low power architecture for register files is provided. A decoder receives a specified bit address divided into a first input and a second input. The decoder is split into a first stage and a second stage. A pre-decoder in the first stage receives the first input, identifies a local bitline that is accessed, and outputs a first signal to a register file array. A post decoder in the second stage receives the second input and the first signal, processes the identification of the local bitline, and generates a second signal to be sent to the register file array. A delay synchronizes the first signal and the second signal so that both signals reach the register file array simultaneously.

38 Claims, 4 Drawing Sheets

LOW POWER ARCHITECTURE FOR REGISTER FILES

FIELD OF THE INVENTION

The present invention relates generally to register files, and more particularly, to a low power architecture for register files.

BACKGROUND

A small, high-speed computer circuit that holds values of internal operations, such as the address of the instruction being executed and the data being processed is termed as a register. For example, when a program is debugged, register contents may be analyzed to determine the computer's status at the time of failure. In microcomputer assembly language programming, programmers reference registers routinely.

Large register files are an important component of today's high-speed microprocessors. For performance reasons, the register file uses dynamic logic and hence significant power dissipation occurs due to the required clocking. What is needed is an architecture that eliminates the need for high-activity clock signals, thereby resulting in lower power dissipation.

BRIEF DESCRIPTION OF THE DRAWINGS

The present invention is illustrated by way of example, and not limitation, in the figures of the accompanying drawings in which.

DETAILED DESCRIPTION

A low power architecture for register files is described. In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention. There are several different ways to implement an independent positioning system. Several embodiments are described herein. However, there are other ways that would be apparent to one skilled in the art that may be practiced without specific details.

Figure 1:
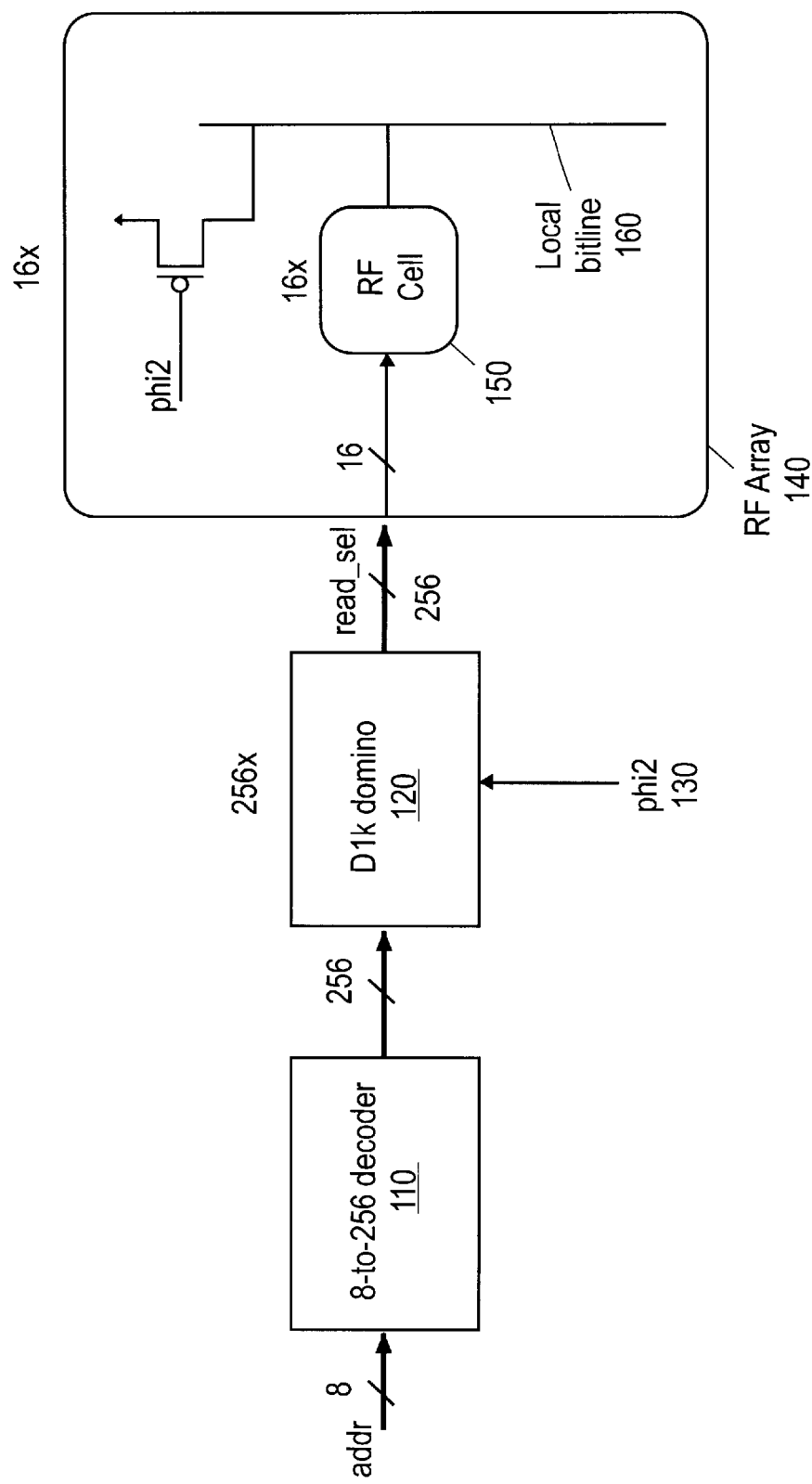
FIG. 1 illustrates one embodiment of conventional register file architecture.

FIG. 1 illustrates one embodiment of conventional register file architecture. The embodiment shown in FIG. 1 assumes a 256 word register file. The read operation is divided into two phases. During the first phase, an 8-bit address is decoded while a local bitline 160 is precharged. In one embodiment, as shown in FIG. 1, an 8-to-25 bit decoder is used. The 8-to-256 decoder receives the 8 bit address input and outputs 256 bits of address. The 256 bits of address move through a D1k domino driver 120 which receives the 256 bits, amplifies the signal, and drives the bits out as a read_select signal.

In one embodiment, as shown in FIG. 1, there are 16 register file arrays 140 so that each register file array 140 takes a 16 bit address. Each 16 bit address goes to a register file cell 150 in a register file array 140. The register file cell 150 is a memory cell, and each register file cell 150 for each register file array 140 is coupled to the local bitline 160. The local bitline 160 connects all of the register file cells 150 to transmit data. In one embodiment, the local bitline 160 connects the 16 register file cells 150, communicating data from the register file cells 150 to remote locations.

Referring back to FIG. 1, in the next phase, the local bitline 160 is discharged depending on the stored data and the decoder output. This architecture results in high transition activity due to the extensive use of high-activity clock signals (phi2) 130. Specifically, clock signals 130 are required inputs to 256 D1k word-line drivers and 16 local bitline precharge transistors. Accordingly, it would be beneficial to reduce the power in register files.

Figure 2:
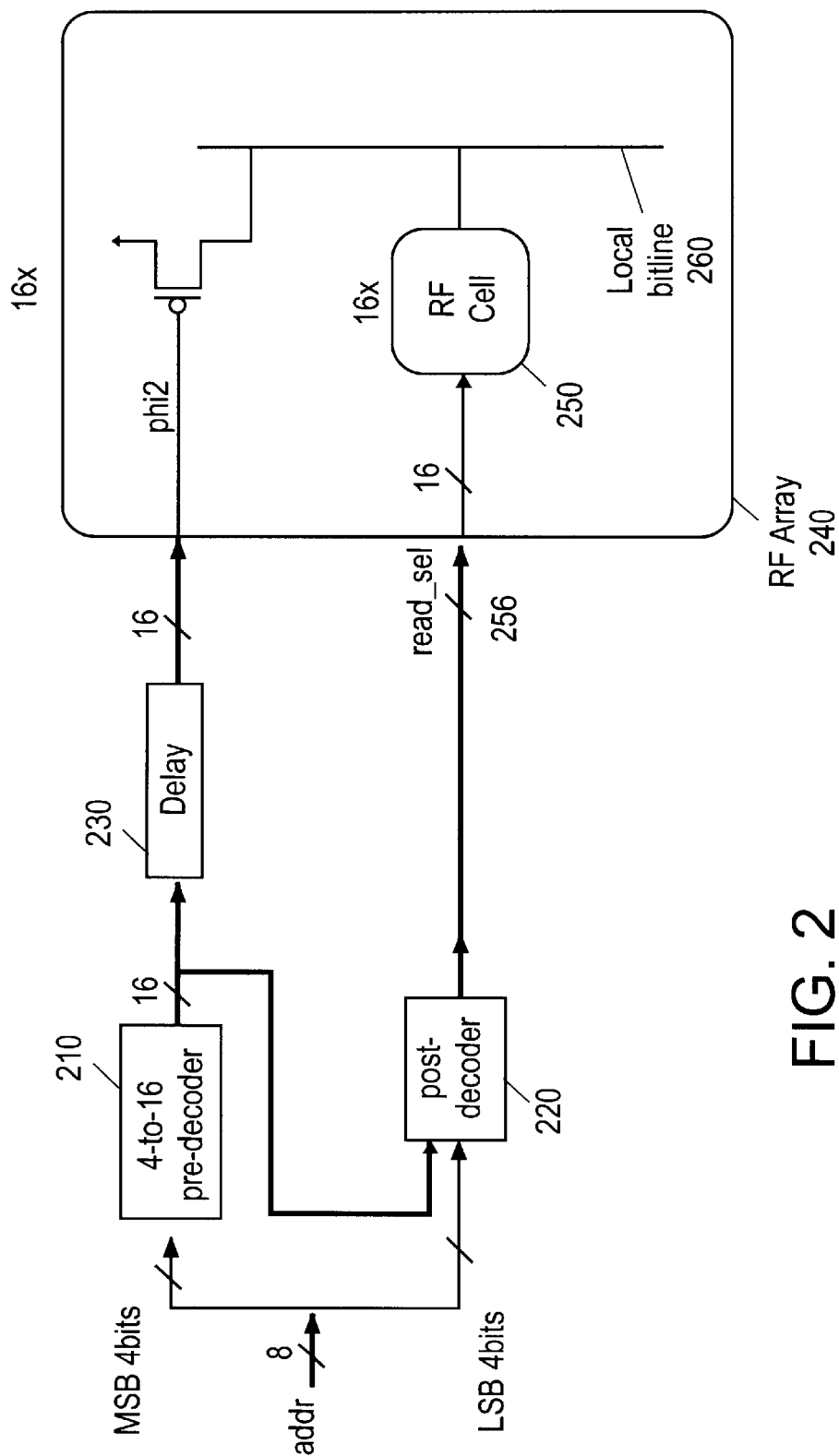
FIG. 2 illustrates one embodiment of a low power architecture for register files.

FIG. 2 illustrates one embodiment of a low power architecture for register files. In one embodiment, the decoder is split into a pre-decoder 210 and a post-decoder 220. In one embodiment, an 8 bit address is the input. In FIG. 2, an 8 bit address input is split into a first input and a second input. The first input includes the 4 most significant bits of the 8 bit address, and the second input includes the 4 least significant bits.

In a first stage, the 4-to-16 pre-decoder takes in the 4 most significant bits. The output from the 4-to-16 pre-decoder 210 is 16 bits. This output includes a local bitline select signal that identifies a local bitline 260 that is accessed. The local bitline select signal directly drives local bitline precharge transistors. Accordingly, the local bitline is held statically.

In a second stage, the post decoder 220 takes the 4 least significant bits and the 16 bits from the pre-decoder 210, and generates a complete 256 bits. The post-decoder 220 uses the output information from the pre-decoder 210 along with the remaining bits of the word address to generate a read select signal. The read select signal is sent to a register file cell 250 in the register file array 240.

A delay 230 is shown in FIG. 2. The delay 230 synchronizes the local bitline select signal and read select signal. Accordingly, the local bitline select signal arrives at the register file array 240 at the same time as the read select signal.

In one embodiment, there are 16 register file arrays. Each register file array receives one local bitline select signal and one read select signal. In one embodiment, as shown in FIG. 2, each register file array 240 takes a 16 bit address. Each 16 bit address goes to a register file cell 250 in a register file array 240. The register file cell 250 is a memory cell, and each register file cell 250 for each register file array 240 is coupled to the local bitline 260. The local bitline connects all of the register file cells 250 to transmit data. In one embodiment, the local bitline 260 connects the 16 register file cells 250, communicating data from the register file cells 250 to remote locations.

Figure 3:
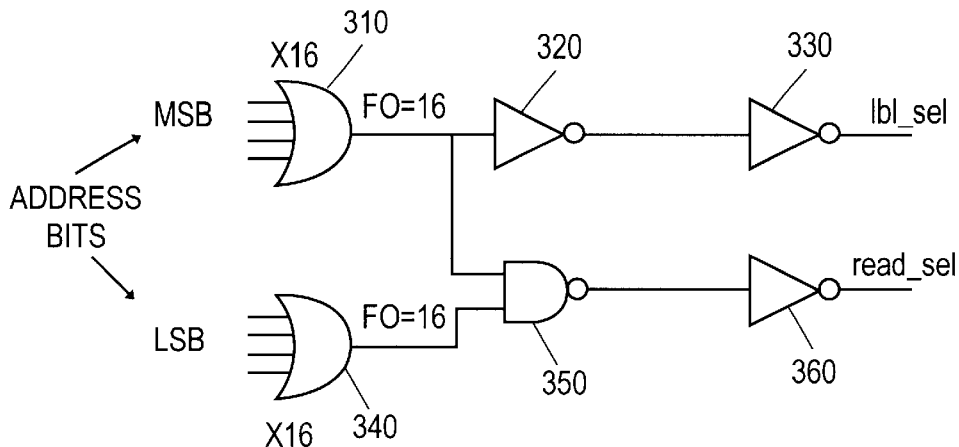
FIG. 3 illustrates a circuit implementation of the decoder shown in FIG. 2.

FIG. 3 illustrates a circuit implementation of the decoder shown in FIG. 2. FIG. 2 represents one circuit implementation of the decoder. However, there may be other circuit implementations of the decoder shown in FIG. 2. An 8 bit address is divided into a first input including the most significant bits of the address and a second input including the least significant bits of the address. The most significant bits are input to a four input OR gate 310 and two inverters 320 and 330 to generate a local bitline select signal. The least significant bits are input to a four input OR gate 340. The output of the OR gate 340 combine with the output of the OR gate 310 and are input to a NAND gate 350 and an inverter 360 to generate a read select signal.

Figure 4:
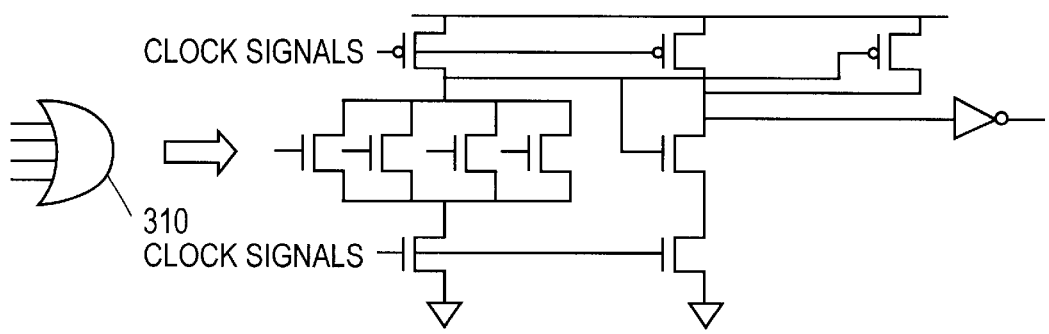
FIG. 4 illustrates the an implementation for the OR gate shown in FIG. 3 at a transistor level.

The present invention reduces the circuit transition activity by using the existing decoder to generate the required timing control signals normally provided by a clock. The local bitline select signals directly drive the local bitline precharge transistors and hence hold the local bitline statically. Instead of an explicit clock, an example of which is shown in FIG. 1, driving the pre-charge transistors, a static signal, in one embodiment called local bitline select signal, drives the pre-charge transistors. Accordingly, a significant amount of clock power is saved thereby reducing dynamic power consumption. Here, clock signals are only required in D1k gates as seen in the circuitry of FIG. 3. FIG. 4 illustrates an implementation for the OR gates shown in FIG. 3 at a transistor level.

Figure 5:
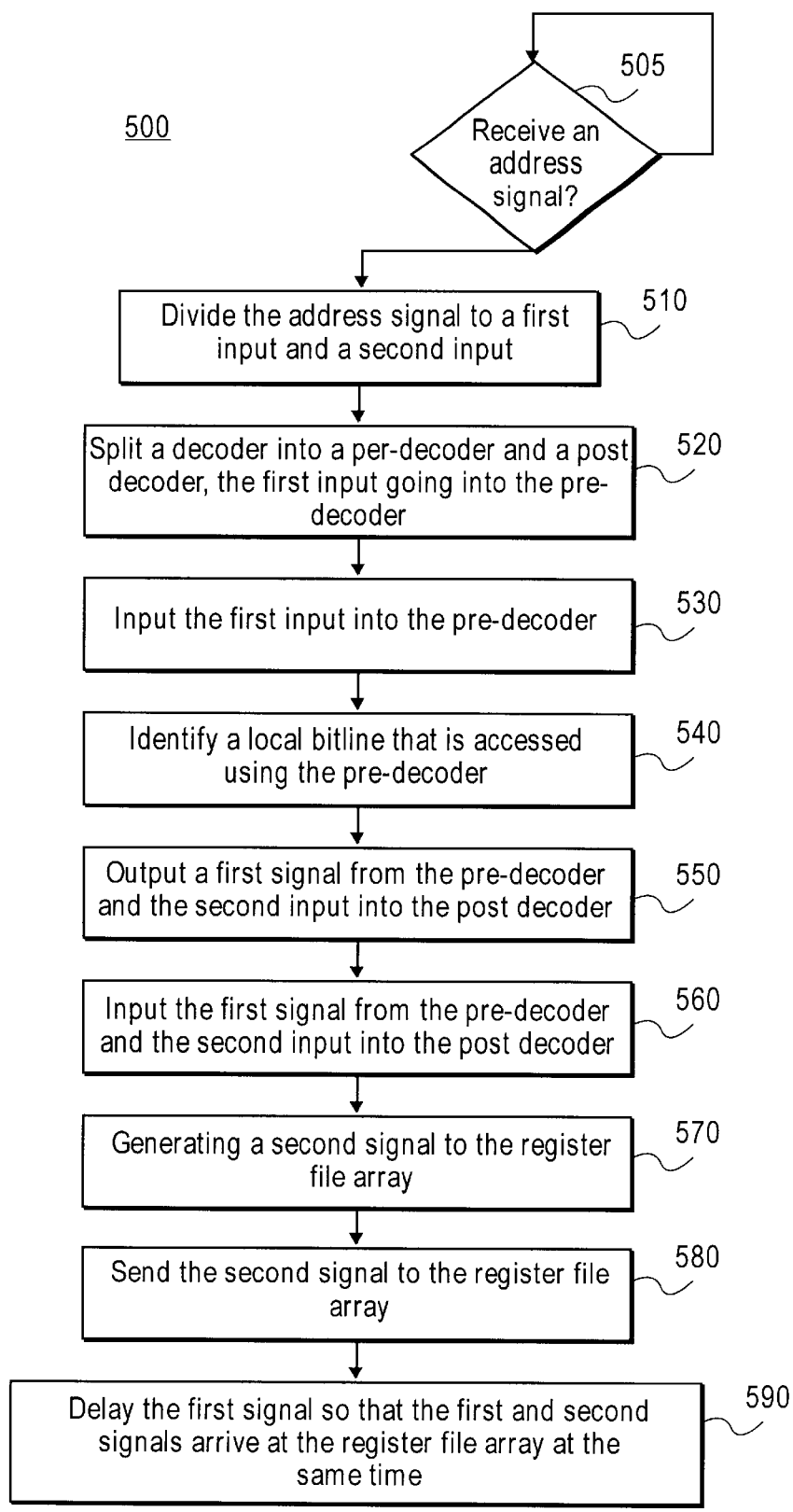
FIG. 5 illustrates one embodiment of a process of lowering power dissipation for register files.

FIG. 5 illustrates one embodiment of a process 500 of lowering power dissipation for register files. At processing block 505, it is determined whether an address signal is received. If an address signal is not received, the process keeps moving back to processing block 505 until an address signal is received.

If it is determined that an address signal is received, the process moves to processing block 510 and the address signal is divided into a first input and a second input. At processing block 520, the decoder is split into a pre-decoder and a post decoder. The first input is inputted into the pre-decoder at processing block 530. At processing block 540, an accessed local bitline is identified by the pre-decoder. At processing block 550, a first signal is output from the pre-decoder to a register file array.

At processing block 560, the first signal from the pre-decoder and the second input are inputted into the post decoder. At processing blocks 570 and 580, a second signal is generated by the post decoder and sent to the register file array. At processing block 590, the first signal is delayed so that the first and second signals arrive at the register file array at the same time.

A low power architecture for register files has been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. An apparatus comprising:
   a decoder split into a first stage and a second stage;
   a pre-decoder in the first stage to identify a local bitline that is accessed and output a first signal to a register file array; and
   a post-decoder in the second stage to process the identification of the local bitline and generate a second signal, the first signal and second signal arriving at the register file array at the same time.

2. The apparatus of claim 1 further comprising a delay to delay the first signal so that the first and second signals arrive at the register file at the same time.

3. The apparatus of claim 2 further comprising 16 register file arrays, each register file array receiving one first signal and one second signal.

4. The apparatus of claim 2 wherein the first signal is 4 bits.

5. The apparatus of claim 4 wherein the second signal is 256 bits.

6. The apparatus of claim 1 wherein the first signal drives local bitline precharge transistors.

7. An apparatus comprising:
   a decoder to receive a specified bit address, the decoder split into a first stage and a second stage, the specified bit address divided into a first input having a number of bits and a second input having a number of bits;
   a pre-decoder in the first stage to receive the first input, the pre-decoder identifying a local bitline that is accessed and outputting a first signal to a register file array;
   a post-decoder in the second stage to process the identification of the local bitline and generate a second signal, the post-decoder receiving the second input in addition to the first signal from the pre-decoder and combining both to generate the second signal; and
   a delay to synchronize the first signal and the second signal so that both signals arrive at the register file array simultaneously.

8. The apparatus of claim 7 wherein the pre-decoder is a 4 to 16 bit decoder.

9. The apparatus of claim 7 wherein a the specified bit address is 8 bits.

10. The apparatus of claim 7 wherein a the first input is four bits.

11. The apparatus of claim 10 wherein the 4 bits are 4 most significant bits.

12. The apparatus of claim 7 wherein the second input is 4 bits.

13. The apparatus of claim 12 wherein the 4 bits are 4 least significant bits.

14. The apparatus of claim 7 wherein the first signal is 16 bits.

15. The apparatus of claim 7 wherein the number of bits in the second signal is 256 bits.

16. The apparatus of claim 7 further comprising 16 register file arrays, each register file array receiving one first signal and one second signal.

17. The apparatus of claim 7 wherein the second signal arrives at a register file cell.

18. The apparatus of claim 7 wherein the first signal drives local bitline precharge transistors.

19. A circuit comprising:
   a decoder to receive a specified bit address, the decoder split into a first stage and a second stage, the specified bit address divided into a first input having a number of bits and a second input having a number of bits;
   a pre-decoder in the first stage to receive the first input, the pre-decoder identifying a local bitline that is accessed and outputting a first signal to a register file array;
   a post-decoder in the second stage to process the identification of the local bitline and generate a second signal, the post-decoder receiving the second input in addition to the first signal from the pre-decoder and combining both to generate the second signal; and
   a delay to synchronize the first signal and the second signal so that both signals arrive at the register file array simultaneously.

20. The circuit of claim 19 wherein the pre-decoder is a 4 to 16 bit decoder.

21. The circuit of claim 19 wherein the specified bit address is 8 bits.

22. The circuit of claim 19 wherein the first input is four bits.

23. The circuit of claim 22 wherein the 4 bits are 4 most significant bits.

24. The circuit of claim 19 wherein the second input is 4 bits.

25. The circuit of claim 24 wherein the 4 bits are 4 least significant bits.

26. The circuit of claim 19 wherein the first signal is 16 bits.

27. The circuit of claim 19 wherein the number of bits in the second signal is 256 bits.

28. The circuit of claim 19 further comprising 16 register file arrays, each register file array receiving one first signal and one second signal.

29. The circuit of claim 19 wherein the second signal arrives at a register file cell.

30. The circuit of claim 19 wherein the first signal drives local bitline precharge transistors.

31. A method comprising:

receiving an address signal, the address signal divided into a first input and a second input;

splitting a decoder into a pre-decoder and a post decoder, the first input going into the pre-decoder;

inputting the first input into the pre-decoder;

identifying a local bitline that is accessed using the pre-decoder;

outputting a first signal from the pre-decoder to a register file array;

inputting the first signal from the pre-decoder and the second input into the post decoder;

generating a second signal from the post decoder;

sending the second signal to the register file array; and delaying the first signal so that the first and second signals arrive at the register file array at the same time.

32. The method of claim 31 wherein the decoder is an 8 to 256 bit decoder.

33. The method of claim 31 wherein the pre-decoder is a 4 to 16 bit decoder.

34. The method of claim 31 wherein the address signal is 8 bits.

35. The method of claim 31 wherein the first input is 4 most significant bits of the address signal.

36. The method of claim 31 wherein the second input is 4 least significant bits of the address signal.

37. The method of claim 31 wherein the first signal is 16 bits.

38. The method of claim 31 wherein the second signal is 256 bits.

\* \* \* \* \*